United States Patent [19]
Garretson et al.

[11] 3,952,410

[45] *Apr. 27, 1976

[54] PROBE CARD INCLUDING A MULTIPLICITY OF PROBE CONTACTS AND METHOD OF MAKING

[75] Inventors: Oliver R. Garretson; Richard C. Harmon, both of Mountain View, Calif.

[73] Assignee: Xynetics, Inc., Mountain View, Calif.

[ * ] Notice: The portion of the term of this patent subsequent to Sept. 10, 1991, has been disclaimed.

[22] Filed: July 16, 1975

[21] Appl. No.: 596,269

Related U.S. Application Data

[60] Continuation of Ser. No. 455,599, March 28, 1974, Pat. No. 3,905,098, which is a division of Ser. No. 386,999, Aug. 9, 1973, Pat. No. 3,835,381, which is a continuation of Ser. No. 799,472, Feb. 14, 1969, abandoned.

[52] U.S. Cl. .................................... 29/628; 29/625
[51] Int. Cl.² ........................................ H01R 43/00
[58] Field of Search ............ 324/158 P, 158 F, 72.5; 29/628, 629, 630 R, 624, 625, 626; 72/DIG. 10; 113/119; 264/272

[56] References Cited
UNITED STATES PATENTS

| | | |
|---|---|---|
| 3,377,514 | 4/1968 | Ruehlemann et al. ...... 339/17 CF X |
| 3,405,361 | 10/1968 | Kattiner et al. ................ 324/158 P |
| 3,437,929 | 4/1969 | Glenn ............................. 324/158 P |
| 3,445,770 | 5/1969 | Harmon .......................... 324/158 P |

OTHER PUBLICATIONS

Brunner et al., Microcircuit Probe, IBM Technical Disclosure Bulletin, Vol. 9, No. 9, 2/1967.

*Primary Examiner*—C. W. Lanham
*Assistant Examiner*—James R. Duzan
*Attorney, Agent, or Firm*—Ellsworth R. Roston

[57] ABSTRACT

Presented is a probe card useful in testing the effectiveness and utility of semiconductor devices and hybrid circuit substrates prior to the application to such devices and substrates of terminal leads for interconnection with other components. The probe card includes a unitary electrically conductive probe assembly including a multiplicity of closely spaced conductive probes arranged in a radiating array to provide a multiplicity of contact tips adapted to be pressed with uniform pressure and contact resistance on the terminal pads of semiconductor devices and hybrid circuit substrates.

6 Claims, 10 Drawing Figures

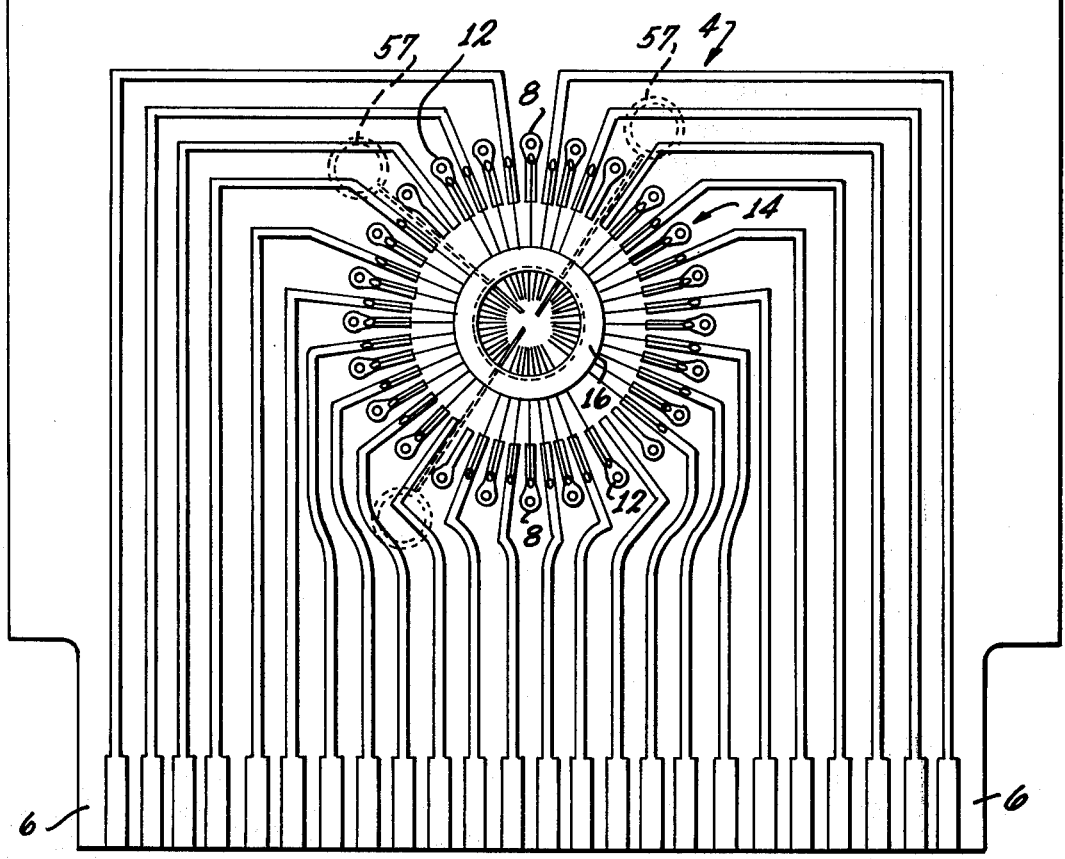

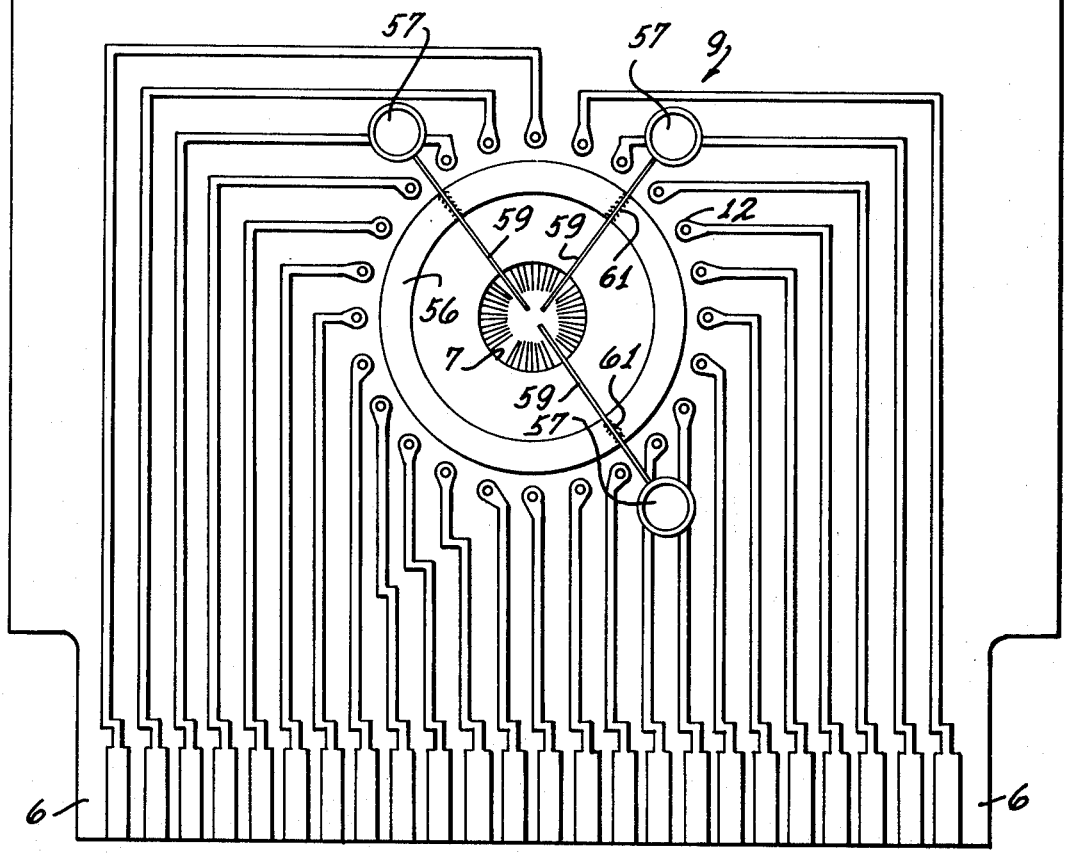

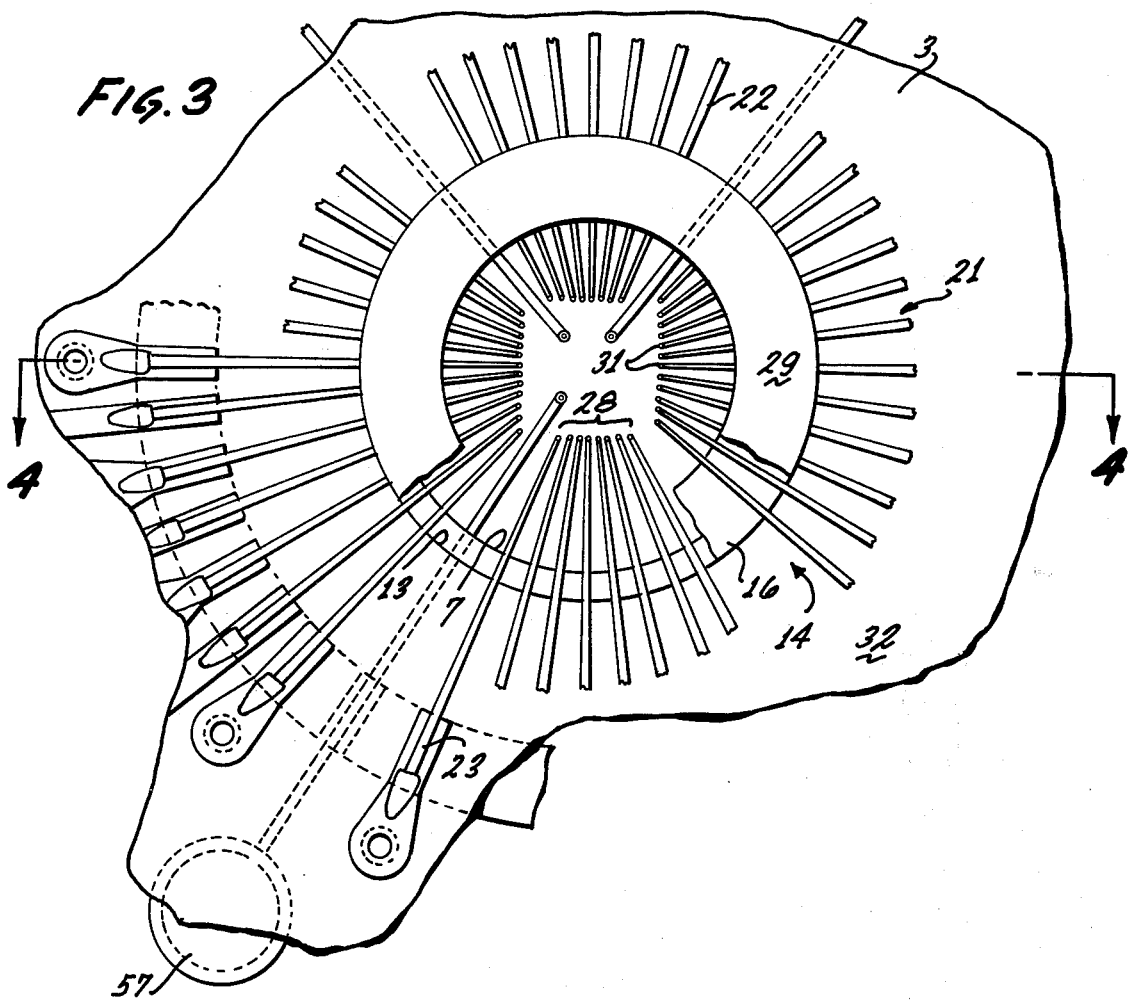
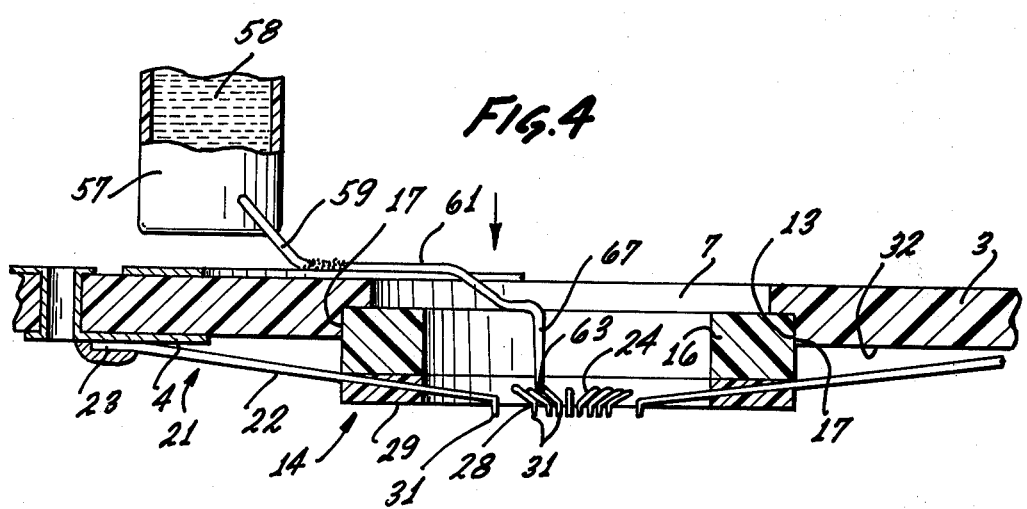

PROBE CARD INCLUDING A MULTIPLICITY OF PROBE CONTACTS AND METHOD OF MAKING

This is a continuation of application Ser. No. 455,599 filed Mar. 28, 1974, now Pat. No. 3,905,908 which in turn was a divisional of application Ser. No. 386,999 filed on Aug. 9, 1973, now Pat. No. 3,835,381 which in turn was a continuation application of prior application Ser. No. 799,472 filed on Feb. 14, 1969 now abandoned.

BACKGROUND OF INVENTION

With the advent of microelectronics, the sizes of components have been reduced significantly, while the complexities attendant to testing of such components has been increased. It is one of the objects of the present invention to provide a more effective and reliable probe card having special utility to effect testing of microelectronic components such as semiconductor devices, hybrid circuits, and substrates from which they are formed.

In the manufacture of semiconductor devices, hybrid circuits and substrates for such devices and circuits, it is advisable that such components be tested to determine if they may reliably be used in end-product electronic equipment prior to installation of such components in the equipment. Preferably, such testing is effected even prior to the application of terminal leads to such components. Because of the minute size of the components, it is frequently difficult to select a given component from an array of such components and impose the necessary tests to determine utility of the component being tested. Accordingly, it is another object of the invention to provide an electrically conductive probe assembly adapted to be mounted on a probe card formed by a printed circuit board, with each of the probes in the probe assembly having a predetermined cooperative relationship with the circuit traces printed on the printed circuit board so as to facilitate the testing of microelectronic semiconductor components, hybrid circuits and the substrate chips from which they are formed prior to or after the application thereto of terminal leads.

It is understandable that since the microelectronic components that must be tested are extremely small, so too the testing devices utilized to effect the test are also frequently minute. The small size of the test device creates problems in connection with its manufacture almost as difficult of solution as the testing procedure itself. Accordingly, it is a still further object of the present invention to provide a novel method of manufacturing a conductive probe assembly for application to a printed circuit card to form a probe card.

A still further object of the invention is to provide a method of manufacturing a conductive probe assembly and of applying such probe assembly to a printed circuit board or card so that both these manufacturing processes are simplified and capable of being carried out by automated means.

Still another object of the invention is to provide a method and means for permanently marking a component being tested to reflect its relative quality or grade in relation to a predtermined norm.

BRIEF SUMMARY OF DISCLOSURE

In terms of broad inclusion, the invention in its several aspects comprises a probe card provided with circuit traces terminating in a radial array about a generally centrally disposed aperture in the card. The aperture provides a guide within which may be mounted a unitary separately fabricated conductive probe assembly including a base of dielectric material and a multiplicity of electrically conductive probes arranged on the base in a radiating array which provides for the terminal ends of the conductive probes to be associated with the circuit traces on the card in a manner that permits the sòldering of a terminal end to an associated circuit trace. The inner ends of the conductive probes are arranged in a selected pattern so that the contact tips lie closely spaced to each other but electrically insulated so as to present separate contact faces lying in a common plane spaced from and parallel to the associated face of the printed circuit board or probe card.

In another aspect of the invention, the unitary conductive probe assembly is manufactured in a way which simplifies the complexities involved and minimizes the cost of manufacture, while producing a probe assembly the contact faces of which are appropriately spaced and aligned in relationship to each other. To effect this purpose a multiplicity of the conductive probes are assembled in a radiating array on an appropriate support which holds the individual conductive probes in proper position. A ring of dielectric material is superposed over the array of conductive probes in a manner to effect embedding of a portion of each probe in the dielectric material, and the assembly so arranged is heated for a time appropriate to effect hardening of the dielectric material to thus retain the radiating array of conductive probes in their selected positions.

A third aspect of the invention involves the method of mounting the unitary conductive probe assembly as described in the immediately preceding paragraph to a printed circuit board or probe card one or both surfaces of which have been provided with circuit traces the inner ends of which terminate in a radiating array about a central aperture in the printed circuit board. The aperture is conveniently circular and rabbeted to provide a shoulder within which the base of dielectric material supporting the conductive probes may seat so that the axis of the base supporting the conductive probes is coincident with the axis of the aperture through the printed circuit board. The parts are proportioned so that when the base of the probe assembly is seated in the aperture, the terminal ends of the probes are appropriately positioned with respect to selected ones of the circuit traces printed on the printed circuit board. The terminal ends of the conductive probes are then soldered to their associated circuit traces. Subsequently, the contact tips of the probes are abraded to provide a multiplicity of flat contact faces all lying in a common plane parallel to the adjacent face of the card.

Since it is inevitable that some of the components tested with the probe card will prove to be defective or sub-grade, it is important to provide means for marking a defective or sub-grade component with a distinctive mark that may readily be seen so that defective and sub-grade components may easily be sorted from useful components. Accordingly, mounted on one side of the printed circuit card are one or more reservoirs for holding a marking ink of distinctive color. Each reservoir is provided with a capillary the terminal end of which is positioned over the component being tested so that upon an appropriate signal the capillary may be depressed so that the terminal end thereof makes contact with the component being tested to deposit on the component a spot of ink which is understood to indicate a defective or sub-grade component.

DESCRIPTION OF DRAWINGS

FIG. 1 is an enlarged plan view of the test side of a probe card showing the unitary conductive probe assembly mounted thereon.

FIG. 2 is an enlarged view of the reverse side of the probe card illustrated in FIG. 1 and illustrating several reservoirs thereon for holding distinctively colored marking inks and the capillaries that extend from the reservoirs to the center of the array of conductive probes.

FIG. 3 is an enlarged fragmentary plan of the central test section of the conductive probe assembly from the test side thereof as illustrated in FIG. 1.

FIG. 4 is a fragmentary cross-sectional view taken in the plane indicated by the line 4—4 in FIG. 3 and illustrating details of construction of the conductive probe assembly and its relationship to the probe card.

DESCRIPTION OF PREFERRED EMBODIMENT

Figure 5:
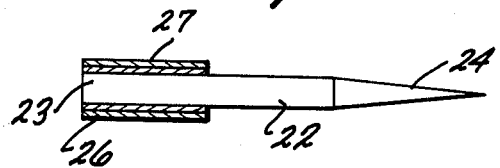
FIG. 5 is an elevational view partly in vertical section of one of the electrically conductive probes after forming but before shaping and shown apart from other structure.

In terms of greater detail, the probe card of the invention including the novel unitary conductive probe assembly is shown in assembled form in FIGS. 1 through 4. As there shown, the probe card is designated generally by the numeral 2, and is conveniently formed in a conventional manner into a flat sheet-like board or "card" 3 constituting a laminate including fiberglass and appropriate synthetic resinous material. The card is provided on side A thereof, as illustrated in FIG. 1, which constitutes the test side of the card, with a multiplicity of printed circuit traces, designated generally by the numeral 4.

Each of the circuit traces on side A of the card terminates at one end adjacent the contact end 6 of the card as shown, and the separate contact ends of the various circuit traces are arranged in a parallel series across the contact end of the card. At their other ends, the circuit traces are arranged in a radial array about a central aperture 7, with each of the terminal ends of each trace being spaced from adjacent circuit traces. On side A of the card as illustrated in FIG. 1, 24 separate and complete circuit traces are provided as shown.

Conventionally, each of these traces carries indicia which facilitates connection of each trace to an appropriate and associated circuit. For purposes of clarity, such indicia has been omitted from the illustration. In addition to the 24 separate and complete circuit traces, short terminal segments 8 of other traces are provided appropriately positioned in the radial array as will hereinafter be explained.

On the reverse or side B of the card, as shown in FIG. 2, circuit traces designated generally by the numeral 9 are provided, each circuit trace applied in a conventional manner. The 24 separate circuit traces on side B are arranged so that corresponding ends of the circuit traces terminate in a series of parallel contact surfaces adjacent the contact end 6 of the card as previously explained in connection with Side A. The other ends of the circuit traces terminate in terminal ends arranged in a radial array about the central aperture.

The circuit traces printed on side B of the card are distinguished from the circuit traces printed on side A by being provided at their ends surrounding the central aperture with terminal means 12 in the form of a conductor that connects at one end with the associated terminal end of the circuit trace on side B and extends through the card to be conductively connected to the short terminal segments 8 printed on side A of the card.

The aperture 7 is formed generally midway between the side edges of the card, and is preferably circular and provided with a rabbet 13, both aperture and rabbet being generally concentrically disposed within the circular array of the associated terminal ends of the circuit traces printed on opposite sides of the card.

Seated within aperture 7, and more specifically seated in rabbet 13, is a unitary conductive probe assembly designated generally by the numeral 14, and including a base 16, preferably annular but which may be formed square, rectangular, C-shaped or of any other configuration required by a specific application. A portion 17 of the outer periphery of the base forms a guide to accurately seat the unitary conductive probe assembly in the rabbeted aperture formed in the card.

It will thus be apparent that the rabbeted aperture and complementary periphery 17 of the base 16 of the conductive probe assembly may be very accurately positioned concentrically with the terminal ends of the circuit traces on opposite sides of the card. Additionally, it will be apparent that by maintaining appropriate tolerances and by using appropriate jigging, the printed probe card may be apertured in one operation, and the unitary conductive probe assembly produced in a separate and distinct series of operations, with the two separate unitary entities then being assembled in a very accurate manner.

Figure 6:
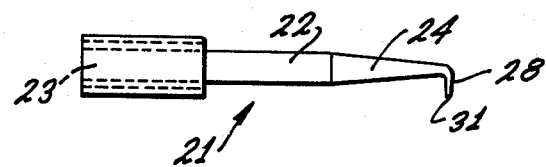
FIG. 6 is an elevational view of a completed conductive probe shown apart from other structure.

The unitary conductive probe assembly 14 includes a multiplicity of separate electrically conductive probes designated generally by the numeral 21, and shown best in FIGS. 3, 4, 6 and 10. Each probe is formed from an elongated wire, preferably fabricated from tungsten, to provide a main body portion 22, a terminal end portion 23 and a contact tip portion 24. Referring specifically to FIGS. 5 and 6, each electrically conductive probe in the embodiment illustrated is approximately ¾ inch in length and fabricated from 0.010 inch tungsten wire. For approximately one-third its length encompassing the terminal end portion 23, each probe is provided with a plated layer of copper 26, which is in turn plated with a layer of gold 27 to facilitate soldering of the plated end of each probe to an associated circuit trace.

Intermediate its ends, and generally in the area encompassed by the body portion 22, the probe wire is left untreated or in "raw" condition. This portion of the probe accounts for approximating another one-third of the length of the probe. The remaining one-third portion of the probe constitutes the contact tip portion 24 and is tapered as shown best in FIG. 5. Such tapering may be effected by any convenient means. Following tapering of the contact tip portion, the extreme end of the contact tip portion, for a length approximating 0.020 inch, is bent at right angles to the axis of the conductive probe to provide a contact tip 28 for purposes which will hereinafter be explained in greater detail.

A multiplicity of the conductive probes thus formed are arranged about the base 16 in a radial array in which each of the separate conductive probes is spaced and electrically insulated from adjacent probes. Each probe is secured to the base 16 by a layer 29 of an appropriate dielectric material which has the characteristics of curing and hardening with passage of time or application of heat. As shown in FIG. 4, the terminal end 23 of each probe is soldered to the associated trace 4 while the intermediate portion 22 of the probe is supported on the base 16 so that the inner contact tip portion of each probe projects inwardly from the inner periphery of the base 16 and terminates in the contact tip 28, the axis of which is generally perpendicular to the axis of the probe and parallel to the central axis of the base and aperture within which it is seated.

It will thus be seen that the contact tips 24 of all the probes project downwardly in FIG. 4 and terminate generally in a common plane. Inasmuch as it is important that the contact faces 31 of the probes lie in a common plane so that when the probe assembly is applied to a substrate all of the contact faces will impinge upon the substrate and exert essentially the same amount of contact pressure, the exposed ends of the contact tips 24 are abraded so that the contact faces 31 will lie in a common plane which is parallel to the associated face 32 of the card 3.

Some idea of the complexities of manufacturing a unitary probe assembly such as discussed above will be apparent when it is considered that in conventional probe cards alignment of the contact tip portions is secured and maintained by providing a permanent patterned mask formed by a thin sheet of synthetic resinous material such as "Mylar" having separate apertures therein in a selected pattern through which the contact tips extend. The diameter of the apertures in such conventional Mylar masks is usually in the order of 0.004 inch, with the contact tips passing through such apertures without touching the sides. Thus, the spacing between separate contact tips is in the order of 0.001 inch or 0.002 inch, so that a multiplicity of contact faces may be provided in a minimum area while still remaining electrically insulated one from the other.

Figure 7:
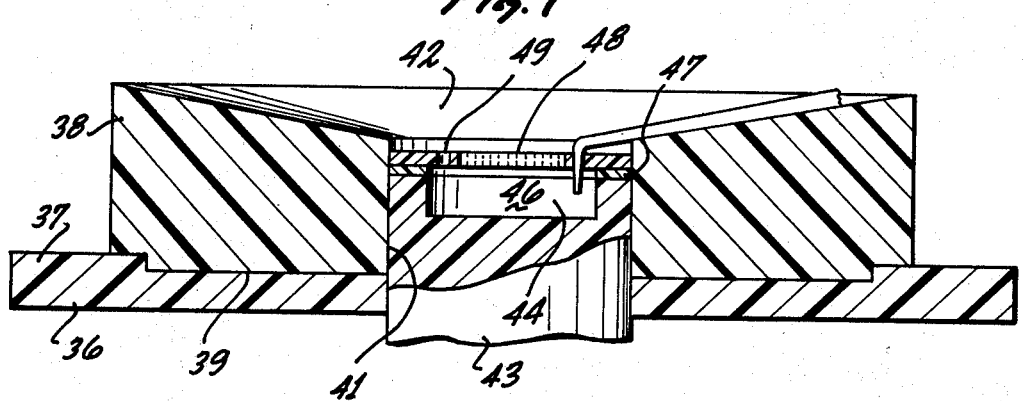
FIG. 7 is a vertical cross-sectional view of a fixture utilized to facilitate assembly of a multiplicity of probes in a prescribed pattern or array.
Figure 8:
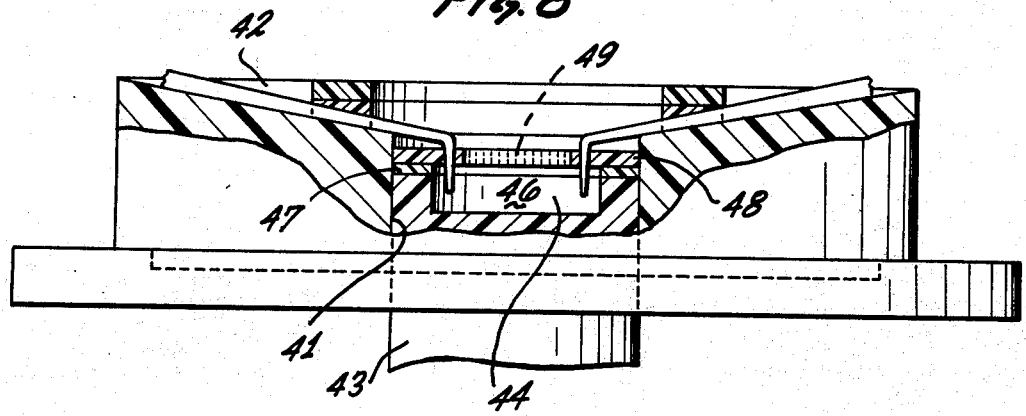
FIG. 8 is a view similar to FIG. 7 but adding the base member of dielectric material in which the probes are embedded.
Figure 9:
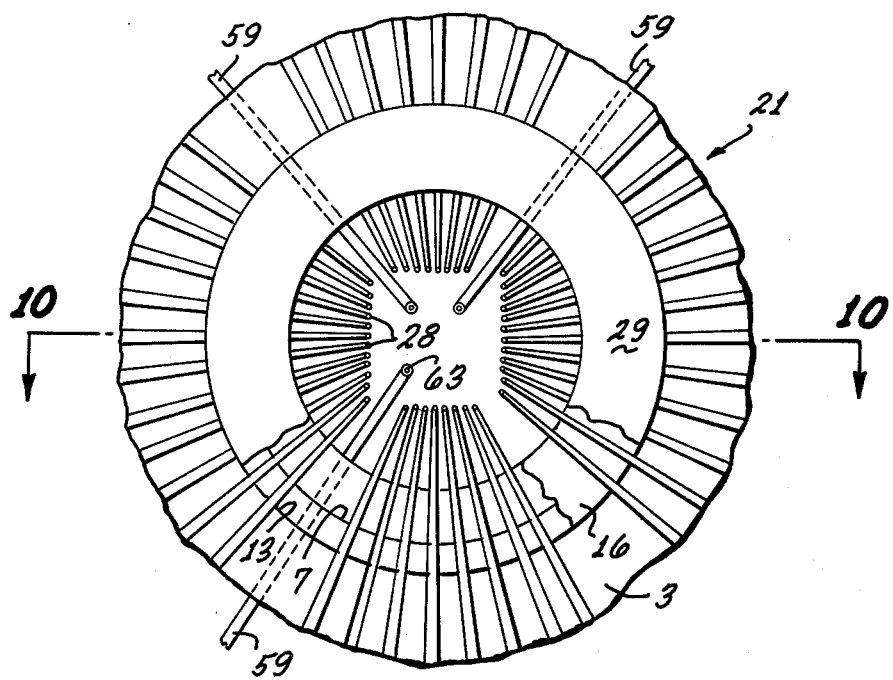
FIG. 9 is a plan view of a unitary probe assembly.
Figure 10:
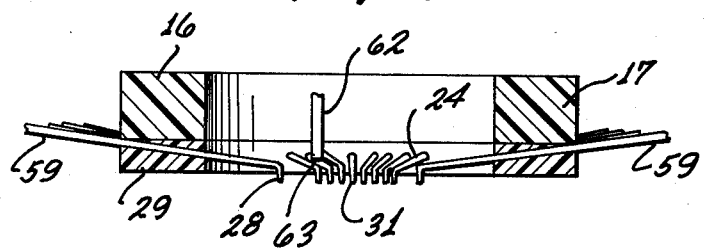
FIG. 10 is a vertical cross-sectional view of the probe assembly taken in the plane indicated by the line 10—10 in FIG. 9.

To facilitate the fabrication of a unitary conductive probe assembly, reference is made to FIGS. 7 and 8 wherein there is shown a fixture including a plate 36, having a top surface 37 supporting a ring-like support member 33, the bottom end 39 of which is shaped to complement the top surface of the support plate 36. The support ring 33 is provided with a central bore 41, and the upper surface 42 of the ring support 38 is tapered toward its central axis to provide an annular inclined surface as clearly shown in FIGS. 7 and 8.

Projecting into the bore 41 in the support ring is a central column 43 the upper end of which is formed to provide a recess or hollow 44 surrounded by an annular flange 46 as shown. The upper end of the annular flange 46 is provided with a layer 47 of adhesive, which may conveniently take the form of double-sided tape, one side of which is caused to adhere to the upper edge of the flange 46 and the opposite side being left exposed for securement to a superposed layer of a synthetic resinous sheet 48 such as clear transparent "Mylar" as shown. The Mylar is preferably in the order of approximately 0.006 inch thick and is provided with a multiplicity of apertures 49 arranged in whatever pattern it is desired the contact tips 24 should lie when the unitary probe assembly is completed. It should be understood that the Mylar mask 48 used in this instance constitutes a part of the fixture and not a part of the probe assembly.

A multiplicity of probes, of the type pand configuration illustrated in FIG. 6, are deposited on the inclined surface 42 of the ring support and arranged to correspond with the radial array formed by the circuit traces on the probe card for which the probe assembly is intended. To facilitate such orientation, the upper inclined surface 42 of the ring support is preferably overlaid with a mask on which has been photographed the specific pattern of the radial array for which the probe assembly is intended.

With the contact tips 24 projecting through apertures 49, the terminal ends 23 of the probes are oriented so that each engages an associated circuit trace. After proper orientation the base 16, shown in FIG. 8 to be an annulus, is coaxially superimposed over the probe array. Prior to its application, the base 16 is provided on one surface with the layer 29 of dielectric material, which when the base 16 is placed over the probes is of a soft consistency so as to embed the probes in the dielectric material 29.

It has been found that it is preferable that the base 36 and center column 43 be fabricated from "Lucite," and the support ring 38 from "Teflon." Such materials facilitate adjustment of the parts, and prevent sticking of the plastic dielectric layer 29 to the top surface 42 of the ring support when the probes are embedded.

The fixture thus formed, with the now stabilized array of conductive probes, is then placed in an oven and heated to a temperature of approximately 200° F. Such heating is continued for approximately one hour to effect rapid hardening of the layer 29 of dielectric material so as to permanently retain the probes in their selected orientation.

After the unitary conductive probe assembly is completed, it is superposed over the probe card so that the outer periphery portion 17 of the base 16 seats in the rabbet 13 formed about aperture 7 in the card. It will of course be obvious that rather than providing a rabbeted aperture in the card, a peripheral portion 17 of the base may be reduced in diameter to form a seat, or in the alternative, the outer periphery of the base 16 may be seated directly in the aperture 7. With the probe assembly seated in the aperture, the assembly is oriented so that the radially outwardly projecting terminal end portions of the probes lie in engagement with associated circuit traces on the card. Each terminal end 23 of a probe is then soldered to the associated trace as indicated in FIG. 4.

In a testing procedure involving many hundreds of thousands of semiconductor devices, hybrid circuits, and substrate chips from which devices are fabricated, it is not unusual that some of the substrate chips tested will be defective or fall into a predetermined qualitative sub-grade or grades. Means are provided on each probe card facilitating the marking of each of the components tested in accordance with a predetermined marking understood to indicate either a defective or sub-grade condition.

Referring to FIGS. 2, 3 and 4, there is shown on side B of the card illustrated in FIG. 2, an annular area plated with a layer of copper 56 concentrically disposed about the aperture in the card and interposed between such aperture and the concentric array of terminals formed by the ends of circuit traces 9. Superimposed at selected locations about the card are a plurality of reservoirs constituting small thimble-type hollow containers 57 for holding and dispensing a quantity of a marking ink 58.

The reservoir is preferably fabricated from Teflon, and in actual size stands approximately ¼ inch high by 3/16 inch in diameter, and is provided on one side with a hole through which extends a capillary 59, the inner end of which is in communication with the interior of the reservoir. The capillary is provided with a series of jogs as indicated best in FIG. 4 so that a relatively straight and horizontal body portion 61 of the capillary extends radially across the plated annular area 56 and in contact therewith so that the body portion 61 of the capillary may be soldered thereto. The free end of the capillary is turned downwardly in an applicator portion 62 the extreme free end 63 of which normally lies spaced a small distance above the plane containing the contact faces 31 of the individual probe tips.

By capillary action, a marking ink from within the reservoir will migrate through the capillary and form a bulging meniscus at the applicator end 63. When a test determines that the chip or substrate under test is defective, the free end of the capillary is depressed downwardly in the direction of the arrow 64 in FIG. 4 to bring the ink-coated end of the capillary into contact with the defective or sub-grade substrate. Such depression is only a momentary act, the capillary being immediately released, with the effect that a small spot of marking ink will be deposited on the substrate under test. Such spot is effective to distinguish the defective or sub-grade component from other and adjacent components which have successively passed the test. The capillary is conveniently fabricated from 0.007 inch outside diameter stainless steel tubing with a 0.004 inch inside diameter. Momentary depression of the capillary may be effected by hand or by any suitable automatic means such as a solenoid.

Having thus described our invention, what is claimed to be novel and sought to be protected by letters patent is as follows:

1. A method of producing an electrically conductive probe assembly for testing a substrate having a plurality of terminals,
   providing a support member having a support surface with a tapered configuration and having a central aperture,
   providing positioning means with a plurality of apertures corresponding to the positions at which the tips of a plurality of electrically conductive probes are to be disposed in the central aperture of the support member,
   providing a printed circuit board with an aperture positioned at an intermediate position on the board and with a plurality of printed circuit leads disposed in spaced relationship to one another on the board and with the printed circuit leads extending at one end to a position adjacent to the aperture and at the other end to a position adjacent to at least one edge of the board,
   disposing a plurality of electrically conductive probes on the tapered support surface of the support member in spaced relationship to one another and with the tips of the probes extending through the apertures in the positioning means and with the opposite ends of the probes adjacent individual ones of the printed circuit leads,
   electrically connecting the probes to the associated ones of the printed circuit leads on the printed circuit board,
   providing a base having a support surface with a central aperture,
   adhering the support surface on the base to the conductive probes such that the electrically conductive probes are supported on the support surface on the support member, and
   removing the support member from the probes after adhering the tapered support surface on the base to the probes.

2. The method set forth in claim 1, including the following steps:
   providing at least one container on the surface of the printed circuit board, and
   connecting a capillary to communicate with the container at one end and to be disposed adjacent the substrate at the opposite end.

3. The method set forth in claim 1, wherein a dielectric material is applied to the support surface of the base and the electrically conductive probes are embedded in the dielectric material and the base is disposed on the support member with the support surface of the base facing the tapered surface of the support member and the base and the support member are heated to obtain a hardening of the dielectric material before the support member is removed from the probes.

4. A method of producing an electrically conductive probe assembly for testing a substrate having a plurality of terminals,
   providing a support member having a support surface with a tapered configuration and having a central aperture,
   providing a sheet with a plurality of apertures having positions corresponding to the positions desired for a plurality of probes in the probe assembly,
   disposing the sheet in the central aperture,
   providing an electrically insulating printed circuit board with an aperture at an intermediate position in the board and with a plurality of electrically conductive printed circuit leads disposed on the board and extending from a position near at least one extremity of the board to a position near the aperture of the board,
   providing a plurality of electrically conductive probes made from a flexible material and bent near the tip at one end,
   positioning the plurality of probes with one end resting on the tapered surface of the support member in spaced relationship to one another and in adjacent relationship to the printed circuit leads and with the other ends extending at their bent tips through the apertures in the sheet,
   providing a base with a support surface,
   disposing the support surface on the base in contiguous relationship to the support surface on the support member to obtain the disposition of the probes in contiguous relationship to the support surface of the base,
   providing for a transfer of the probes from the support surface on the support member to the support surface on the base, and thereafter removing the support surface on the support member from the probes.

5. The method set forth in claim 4, wherein a dielectric material is applied to the support surface of the base and the probes are embedded in the dielectric material on the support surface of the base in contiguous relationship to the support surface of the support member and the base and the support member are heated to harden the dielectric material on the support surface of the base with the probes embedded in the dielectric material.

6. The method set forth in claim 4, wherein a container is disposed on the printed circuit board for holding marking ink and a capillary is disposed in communication with the container at one end and in contiguous relationship with the printed circuit board at the other end for providing a marking of printing ink on the printed circuit board when the capillary contacts the substrate.

* * * * *